METHOD OF GROWING SEMICONDUCTOR CRYSTALS

Filed Jan. 16, 1967

United States Patent Office 3,484,302

Patented Dec. 16, 1969

3,484,302

METHOD OF GROWING SEMICONDUCTOR CRYSTALS

Kazuo Maeda, Kanagawa-ken, and Junzi Sato, Tokyo, Japan, assignors to Fujitsu Limited, Kawasaki, Japan, a corporation of Japan Filed Jan. 16, 1967, Ser. No. 609,660
Claims priority, application Japan, Jan. 18, 1966, 41/2,693
Int. Cl. H01l 7/34
U.S. Cl. 148—1.5 3 Claims

ABSTRACT OF THE DISCLOSURE

Semiconductor crystals are grown by a process whereby a semiconductor growth source wafer and semiconductor substrate wafer are in face-to-face relationship with an interposed metal film, plated film or foil. A temperature gradient is applied whereby the film or foil forms a molten zone which moves through the growth source wafer, recrystallizing it and adherently bonding it to the substrate wafer. In another embodiment an oxide or a nitride layer is interposed between the substrate wafer and the film or foil.

Our invention relates to a method of growing semiconductor crystals, such as silicon. According to our invention the desired semiconductor crystal layer is formed on the substrate by using a substrate wafer, a growth source wafer and an evaporated metal film, a plated film or a foil.

There are a great number of conventional methods for growing semiconductor crystals. The "epitaxial" method of forming, on the substrate, a thin single crystal layer of which the thickness and the specific resistance can be easily determined is widely utilized. In that method, the crystal is grown by the hydrogen reduction or pyrolytic reaction of the chloride of the semiconductor element or similar techniques.

Also, the semiconductor layer may be prepared by using a metal of a certain kind as the solvent and by controlling the solution, growing the semiconductor crystal on a special substrate in such a manner that the solute is precipitated from the supersaturated state. In this method, however, it is difficult to control the temperature of the solvent, the solute, etc., making it impossible, at the present technological stage, to use this method for manufacturing circuit elements such as transistors. At this point of technology, the process called the gaseous phase growth technique is far superior.

Our invention is an improvement of the conventional liquid phase growth method, wherein a metal is used as the solvent. Our process is similar to epitaxial techniques and is well suited for the production of large quantities of semiconductors. Furthermore, the manufacturing equipment is extremely simple and the material is inexpensive. As a further feature, the semiconductor crystal may also be grown on a film of a glassy material. In the latter case, a growth layer of a fairly excellent crystallization can be obtained although the substrate crystal is not monocrystalline. Our invention thus provides an important technical step forward in the isolation, etc., in the integrated circuit technique.

According to our invention, a semiconductor crystal wafer such as silicon or germanium is used as the substrate. The substrate is monocrystalline although polycrystalline substrates also may be used. It is also possible to use a semiconductor on the surface of which a thin glassy film of an oxide is formed, as the substrate.

A single crystal or a polycrystal plate consisting of the semiconductor material to be grown is prepared in wafer form for use as the growth source. Next, the substrate wafer and growth source wafer are placed one upon another. However, prior to this arrangement, an evaporated film or a plated layer of a special metal is grown to a thickness of at least 1μ on at least one of the surfaces of the two wafers that will come into contact with the other. This layer preferably should be attached to both the substrate wafer and the growth source wafer, because it will make the wetting easier and more complete. A foil may also be inserted between the two wafers.

Metals having a low eutectic point with the substrate wafer or the growth source wafer are used as the metal layer. For example, aluminum (eutectic point 830° C.), gold (370° C.) or silver (830° C.) may be used when the semiconductor is silicon. Other metals such as antimony, bismuth, indium, gallium, lead and tin, can also be used. Namely, metals that can be used are in the center of III to V groups of the Periodic Table, and these metals remain in the growth layer in a manner uniformly doped.

Any furnace that can be heated in an inert atmosphere may be used as the manufacturing equipment. If possible, it is desirable to use a furnace so constructed that the substrate wafer and the growth source wafer situated thereon may be placed on the heater so that the temperature, by heat conduction, of the growth source wafer is kept higher than that of the substrate wafer.

After the wafers are placed in the furnace, they are heated within a helium, nitrogen or hydrogen atmosphere. A short time after the beginning of heating, the metal and the semiconductor are wetted at a temperature under the eutectic, whereafter the temperature is fixed at an appointed value and after a certain period of time, heating is stopped and the furnace is cooled gradually. At this point, the process of growing the crystal is completed. The process described above is very rapid and well suited for the production of semiconductors in quantity.

The invention will now be described in greater detail referring to the drawings wherein the same reference numerals are used for equivalents in all figures. In the drawing.

Figure 1:
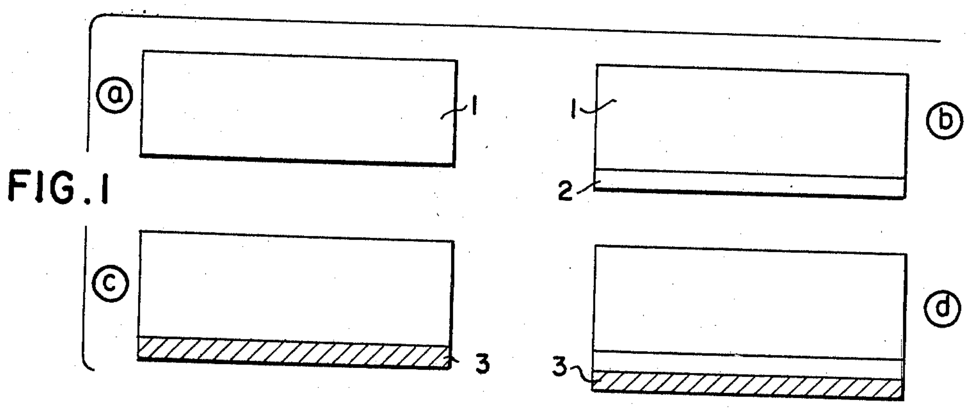
FIG. 1 shows examples of the substrate used for growing the crystal.

Referring now to FIG. 1, ⓐ shows the semiconductor crystal 1 and ⓑ shows the semiconductor crystal with an oxide film 2. Wafers ⓒ and ⓓ are prepared by forming a metal thin film 3 on wafer of ⓐ and ⓑ respectively, by plating or evaporation.

Figure 2:
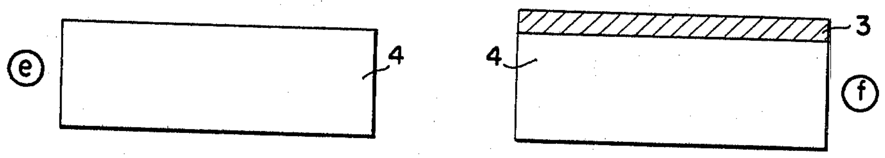
FIG. 2 shows the semiconductor wafers which are used as the growth source.

FIG. 2 shows the growth source wafers 4; ⓔ is the wafer per se and ⓕ is the wafer upon which a metal thin film has been formed by plating or evaporation.

Various combinations of the two wafers can be made. When it is desired to grow the crystal directly upon the semiconductor, one of combinations (c)-(e), (c)-(f) and (a)—a metal foil—(e) is used. When it is desired to grow the crystal upon a film on the semiconductor surface one of combinations (d)-(e), (d)-(f) and (b)-(a) metal foil (e) is used.

Figure 3:
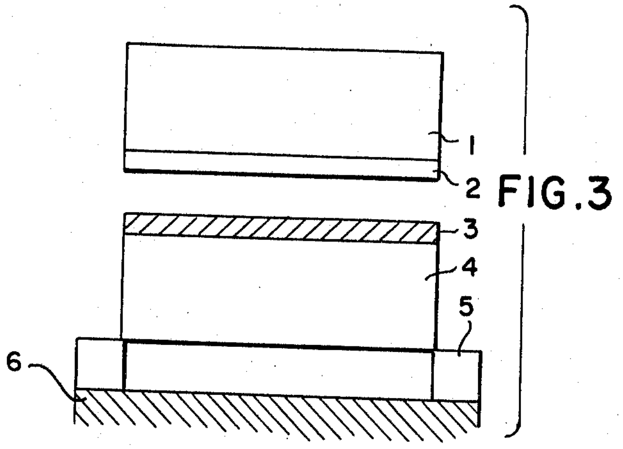
FIG. 3 is a sectional view showing the relation between the positions of the substrate and the growth source when they are actually set in a reaction furnace.

FIG. 3 shows the relation between the positions of the substrate, the growth source and the heater. 5 denotes the spacer and 6 denotes the heater. This figure uses the combination of (b)-(f) as an example. Spacer 5 is placed on heater 6 and semiconductor substrate 1 provided with oxidized film 2 is placed on growth source wafer 4 provided with metal thin film 3 in such manner that the oxidized film 2 and the metal thin film 3 face each other. When the temperature of the heater rises, the temperature of the growth source rises. Then the temperature of the growth source is kept slightly higher than that of the substrate and the metal thin layer 3 therebetween melts, adherently bonding the two wafers to each other by said metal. At this time, the manner of raising the temperature is very important since if the temperature is raised too rapidly, the metal does not melt uniformly but adheres at several points. This results in vacant spaces being produced within the junction of the wafers, precluding an excellent growth layer. It is therefore necessary that first of all the metal, the substrate and the growth source be wetted at a relatively low temperature. Furthermore, if the furnace is cooled at the completion of the growth process, a thick layer of eutectic alloy of the metal used and the semiconductor (growth source) is formed at the end of the growth layer, precluding an excellent semiconductor.

Figure 4:
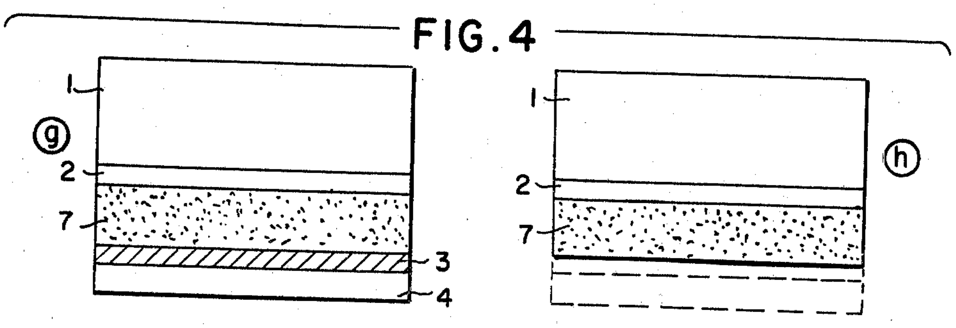
FIG. 4 shows an example of the sectional view of the crystal after growth.

FIG. 4 (g) shows the state after growth. 7 designates the portion which has grown and 3 designates the metal thin layer which has moved. FIG. 4 (h) shows the crystal after growth wherein both 3 and 4 have been removed.

In the above process, if the substrate wafer 1 is substituted by a semiconductor substrate having thereon a film 2 on which a semiconductor crystal layer of $1\sim10\mu$ has been further formed by the gaseous phase growth, etc., the wetting with the metal thin film 2 becomes good and an excellent crystal layer can be obtained.

The growth process will now be described in still greater detail. In FIG. 3, the substrate wafer, the oxide film, the metal solution and the semiconductor growth source are sequentially placed one upon another. As the crystal grows, the zone of metal solution moves gradually downward from the side of the lower temperature to the side of the higher temperature, i.e. into the interior of the growth source until it reaches the lowest end of the growth source. The region through which said zone has moved can be called the "recrystallized region." Therefore, the growth source needs not be monocrystalline but may be polycrystalline. Also, even when the oxide film is provided on the substrate, if a single crystal is used as the growth source, a grown layer having the crystal of large particles and of an excellent crystallization can be obtained even though said grown layer may not be a single crystal. The metal used is uniformly distributed and saturated within the grown layer. It also becomes possible to control the quantity of the impurities if a doping metal or an alloy of such a metal and another metal is used in the thin layer.

It is most advisable to make the thickness of the metal zone above 1 $\mu$m. by the plating or the vacuum evaporation. If said thickness is under 1 $\mu$m., a uniform "wetting" with the semiconductor substrate and the growth source cannot occur. However, if the thin metal layer is provided on both wafers, this danger is eliminated to some extent. When a foil is used, its thickness preferably should be under 10 $\mu$m. The thickness may also be above 10 $\mu$m. but, in many cases, this should be avoided since the layer of the eutectic alloy of the metal and the semiconductor becomes thick and the grown layer is reduced. The growth velocity is affected by the width of the zone and the temperature of the growth source. However, when the width of the zone is above 1 $\mu$m., the change of width barely affects the growth velocity.

The temperature of growth has only to be above the eutectic point of the metal and the semiconductor material used. For example, when growing silicon, the growth occurs at 600° C.$\sim$1200° C. (In this case, aluminum, gold, etc. are used.) Usually with silicon, monocrystalline growth does not occur under 1000° C., even when the gaseous phase growth method is used. According to our invention, however, the growth occurs at 600° C. Moreover, the growth velocity was about $1\mu$/min. When aluminum was used, a velocity as high as $100\mu$/min. was seen at 1200° C. The metal zone finally reaches the bottom of the growth source wafer. When the metal zone is stopped before reaching the bottom, the portion of the wafer under the zone should be removed by etching or lapping. If the substrate is a single crystal, the grown layer thus obtained is completely monocrystalline. If an oxidized film is provided beneath the substrate, the substrate and the grown layer will be thereby insulated. This can be used without any further processing for the assembly of elements using epitaxial growth and is also most suited as the reverse epitaxial growth, since a uniform dope layer of a high concentration can be obtained. Furthermore, since the silicon grows on the silicon oxide film, the process of this invention can be used for the constitution of the isolation in an integrated circuit. As another feature, the manufacturing process is simplified and the time required for the manufacture is also greatly reduced.

A more specific embodiment of the invention is given hereinbelow.

A 1 $\mu$m. silicon nitride layer was coated onto a silicon substrate by gaseous phase growth. A 2 $\mu$m. aluminum layer was deposited on said silicon nitride by vacuum evaporation. A 2 $\mu$m. aluminum layer was deposited by vacuum evaporated on a silicon polycrystal source wafer having a thickness of 300 $\mu$m.

The substrate and wafer were placed one upon another in such a manner that the two aluminum layers oppose each other. The composite was placed on the heater in such a manner that the polycrystal silicon was on the side of the heater and was heated at 1200° C. in a gas current of inert or inactive gas. After five minutes the heating was stopped and the crystal was taken out. It was then found that the silicon substrate and the polycrystal silicon wafer were bonded adherently and aluminum was exposed beneath the polycrystal silicon. Sectioning the crystal showed that the silicon substrate and the polycrystal silicon were bonded with each other completely through the silicon-nitride film with no vacant space therebetween. Furthermore, no aluminum entered through the silicon nitride film. After removing the aluminum by etching and lapping, the specific resistance was measured. A low resistance value of P type was found. Measurement of the impurities concentration of the substrate exclusively indicated that absolutely no change occurred in the concentration by heating.

Other variations are within the scope of this invention. For instance, the substrate and source may be of germanium, etc.

We claim:

1. A method of growing semiconductor crystals which comprises:
- providing a semiconductor substrate wafer,
- forming a layer of an oxide or a nitride on the surface of said substrate wafer,
- providing a semiconductor growth source wafer,
- forming a metal or alloy film on the surface of said source wafer, said film being capable of forming a low temperature eutectic with the source wafer,
- placing the substrate wafer and the source wafer into face to face relationship with the metal film and the oxide or nitride layer therebetween to form a composite, heating said composite to a temperature at which the metal or alloy film forms a molten zone, and in such a manner that a temperature gradient is formed between the source and the substrate with the source being hotter, whereby the molten zone moves gradually from the low temperature side of the growth source to the side of higher temperature, recrystallizing said source and adherently bonding said composite together.

2. The method of claim 1, wherein the film is a foil of metal under 10 μm.

3. The method of claim 2, wherein the semiconductor substrate wafer is silicon, said layer is silicon nitride, the metal foil is aluminum, and the heating temperature is 1200° C.

References Cited

UNITED STATES PATENTS

| | | | |
|---|---|---|---|
| 3,205,101 | 9/1965 | Mlavsky et al. | 148—171 |
| 3,278,342 | 10/1966 | John et al. | 148—1.6 |
| 3,301,716 | 1/1967 | Kleinknecht | 148—1.5 |

L. DEWAYNE RUTLEDGE, Primary Examiner

P. WEINSTEIN, Assistant Examiner

U.S. Cl. X.R.

23—300, 301; 29—472.7, 473.1, 569; 117—201, 212; 148—1.6, 171, 172